(12) United States Patent
Yueh (10) Patent No.: US 11,914,167 B2
(45) Date of Patent: Feb. 27, 2024

(54) DISPLAY DEVICE IN APPLICATION OF VEHICLE

(71) Applicant: InnoLux Corporation, Miao-Li County (TW)

(72) Inventor: Jui-Jen Yueh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/102,775

(22) Filed: Jan. 30, 2023

(65) Prior Publication Data
US 2023/0176394 A1    Jun. 8, 2023

Related U.S. Application Data

(63) Continuation of application No. 17/750,411, filed on May 23, 2022, now Pat. No. 11,586,050.

(30) Foreign Application Priority Data

Jun. 23, 2021 (CN) .......................... 202110697322.6

(51) Int. Cl.
*G02B 27/60* (2006.01)
*B60K 35/00* (2006.01)
*H01L 25/16* (2023.01)

(52) U.S. Cl.
CPC .............. *G02B 27/60* (2013.01); *B60K 35/00* (2013.01); *H01L 25/167* (2013.01); *B60K 2370/152* (2019.05)

(58) Field of Classification Search
CPC ........ G02B 27/60; G02B 5/201; B60K 35/00; B60K 2370/152; H01L 25/167; G09F 9/00
See application file for complete search history.

(56) References Cited

U.S. PATENT DOCUMENTS

| | | | | |
|---|---|---|---|---|
| 2013/0057806 | A1* | 3/2013 | Kanemitsu | ........ G02F 1/133606 349/64 |
| 2013/0127609 | A1* | 5/2013 | Sitarski | ................. G06F 3/1431 345/473 |
| 2016/0103262 | A1* | 4/2016 | Kashiwagi | ............. G02B 5/223 362/607 |

(Continued)

FOREIGN PATENT DOCUMENTS

| CN | 107565042 A | | 1/2018 |
|---|---|---|---|
| KR | 20090010711 A | * | 1/2009 |

OTHER PUBLICATIONS

SoHn et al. , KR10-2009-0010711, machine translation (Year: 2009).*

*Primary Examiner* — Tracie Y Green
(74) *Attorney, Agent, or Firm* — Winston Hsu (57) ABSTRACT

A display device in application of a vehicle is provided. The display device includes a self-luminous display device and a non-self-luminous display device. At least one of the self-luminous display device and the non-self-luminous display device includes a display panel and a light controller. The display panel includes a plurality of first signal lines respectively extending along a first direction. The light controller is disposed adjacent to the display panel and includes a plurality of light blocking patterns respectively extending along a second direction, wherein the second direction has an angle with respect to the first direction, and an absolute value of the angle is greater than 0 degree and less than or equal to 45 degrees.

10 Claims, 6 Drawing Sheets

(56) References Cited

U.S. PATENT DOCUMENTS

2018/0006272 A1 1/2018 Lee
2018/0292699 A1* 10/2018 Chen .................... G02F 1/13624
2022/0158043 A1* 5/2022 Lee ....................... H01L 33/502

* cited by examiner

DISPLAY DEVICE IN APPLICATION OF VEHICLE

CROSS REFERENCE TO RELATED APPLICATIONS

This application is a continuation application of U.S. application Ser. No. 17/750,411, filed on May 23, 2022. The content of the application is incorporated herein by reference.

BACKGROUND OF THE DISCLOSURE

1. Field of the Disclosure

The present disclosure relates to a display device, and more particular, to a display device including a light controller.

2. Description of the Prior Art

With the development of technology, display devices may not only be used indoors or held in hands, but also gradually be applied to vehicles, such as be disposed under a windshield of a car. However, when the display device is disposed under the windshield of the car, an image of the display device is reflected back to eyes of a driver through the windshield of the car. Therefore, the driver is easily disturbed by the image and unable to clearly see the situation outside the car, thereby affecting driving safety.

SUMMARY OF THE DISCLOSURE

An embodiment of the present disclosure provides a display device in application of a vehicle. The display device includes a self-luminous display device and a non-self-luminous display device. At least one of the self-luminous display device and the non-self-luminous display device includes a display panel and a light controller. The display panel includes a plurality of first signal lines respectively extending along a first direction. The light controller is disposed adjacent to the display panel and includes a plurality of light blocking patterns respectively extending along a second direction, wherein the second direction has an angle with respect to the first direction, and an absolute value of the angle is greater than 0 degree and less than or equal to 45 degrees.

These and other objectives of the present disclosure will no doubt become obvious to those of ordinary skill in the art after reading the following detailed description of the embodiment that is illustrated in the various figures and drawings.

DETAILED DESCRIPTION

The contents of the present disclosure will be described in detail with reference to specific embodiments and drawings. In order to make the contents clearer and easier to understand, the following drawings may be simplified schematic diagrams, and elements therein may not be drawn to scale. The numbers and sizes of the elements in the drawings are just illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "include", "comprise" and "have" are used in an open-ended fashion, and thus should be interpreted to mean "include, but not limited to . . . ".

When ordinal numbers, such as "first" and "second", used in the specification and claims are used to modify elements in the claims, they do not mean and represent that the claimed elements have any previous ordinal numbers, nor do they represent the order of a claimed element and another claimed element, or the order of manufacturing methods. These ordinal numbers are just used to distinguish a claimed element with a certain name from another claimed element with the same name.

Spatially relative terms, such as "above", "on", "beneath", "below", "under", "left", "right", "before", "front", "after", "behind" and the like, used in the following embodiments just refer to the directions in the drawings and are not intended to limit the present disclosure. It should be understood that the elements in the drawings may be disposed in any kind of formation known by one skilled in the related art to describe the elements in a certain way.

Furthermore, it will be understood that when an element or layer is referred to as being "disposed on" or "connected to" another element or layer, it may be directly on or directly connected to the another element or layer, or intervening elements or layers may be presented (indirectly). In contrast, when an element is referred to as being "directly on" or "directly connected to" another element or layer, there are no intervening elements or layers presented.

In the content, the terms "about", "substantially", and "approximately" generally mean a range within 10%, within 5%, within 3%, within 2%, within 1%, within 1%, or within 0.5% of a given value. The quantity given herein is an approximate quantity, that is, "about", "substantially", and "approximately" may still be implied without specific descriptions of "about", "substantially", and "approximately". Furthermore, the phrase "a range between a first value and a second value" means that the range includes the first value, the second value, and other values therebetween.

It should be noted that the technical features in different embodiments described in the following may be replaced, recombined, or mixed with one another to constitute another embodiment without departing from the spirit of the present disclosure.

In the present disclosure, lengths, thicknesses, and widths may be obtained through measuring with an optical microscope, electron microscope or other measurement methods, but not limited thereto.

Unless otherwise defined, all terms (including technical and scientific terms) used herein have the same meaning as commonly understood by people ordinarily skilled in the art of the present disclosure. It should be understood that, these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

The display device of the present disclosure may have a displaying function, and may selectively include functions such as detection, touch sensing, antenna, other suitable functions, or the combinations of the above-mentioned functions, but not limited thereto. The display device may for example include a tiled display device, but not limited thereto. The display device may for example include liquid crystal molecules (LC molecules), a light-emitting diode, quantum dots materials, fluorescent materials, phosphor materials, other suitable materials, or the combinations of the above-mentioned materials, but not limited thereto. The light-emitting diode may for example include organic light-emitting diode (OLED), micro light-emitting diode (micro-LED), mini light-emitting diode (mini-LED), quantum dots light-emitting diode (QLED, QDLED). In addition, the display device may be a color display device or a monochrome display device. The appearance of the display device may be rectangular, circular, polygonal, a shape with curved edges or other suitable shapes. The display device may include peripheral systems such as a driving system, a controlling system, a light source system and a shelf system to support the display device.

Figure 1:
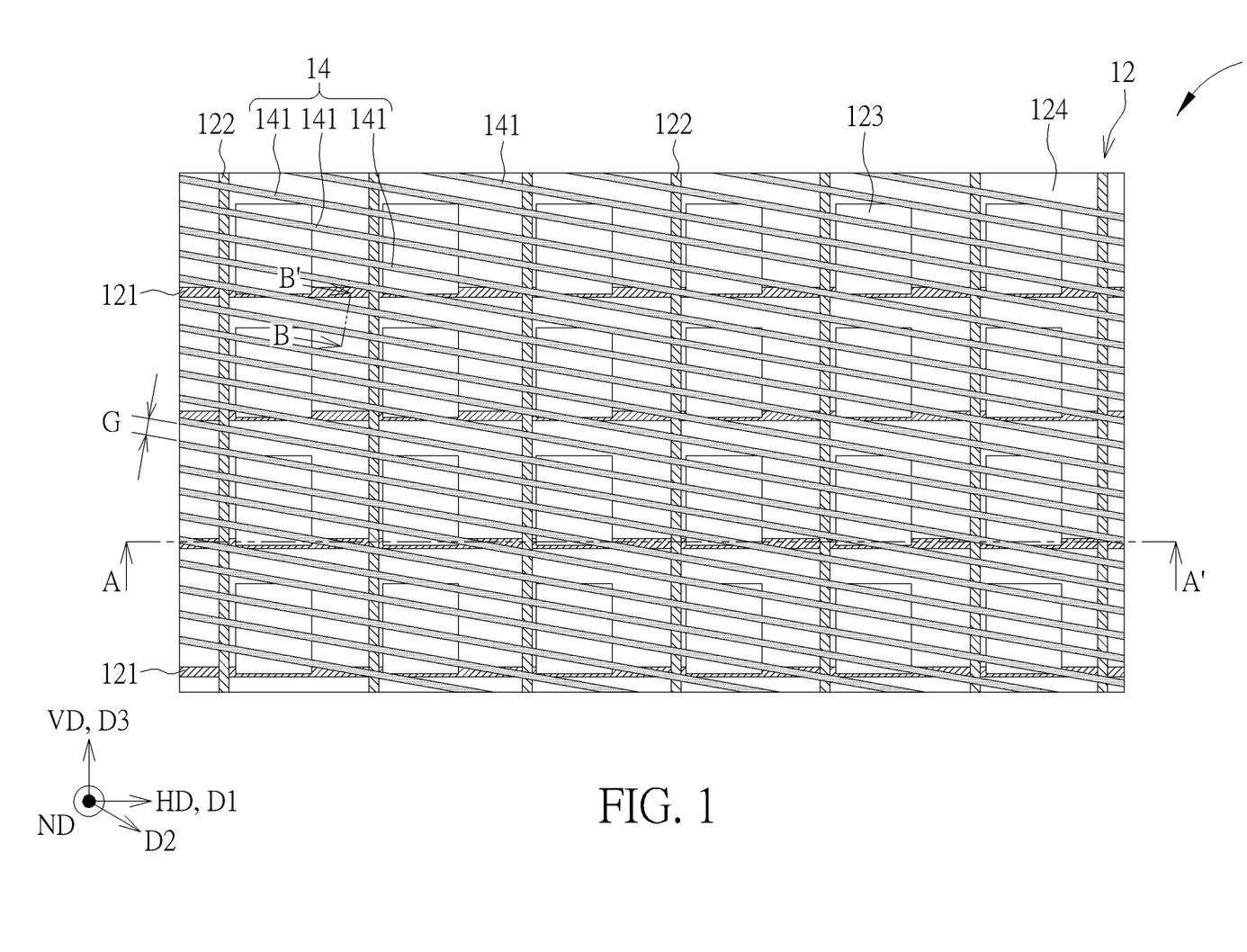
FIG. 1 is a schematic top view of a display device according to an embodiment of the present disclosure.
Figure 2:
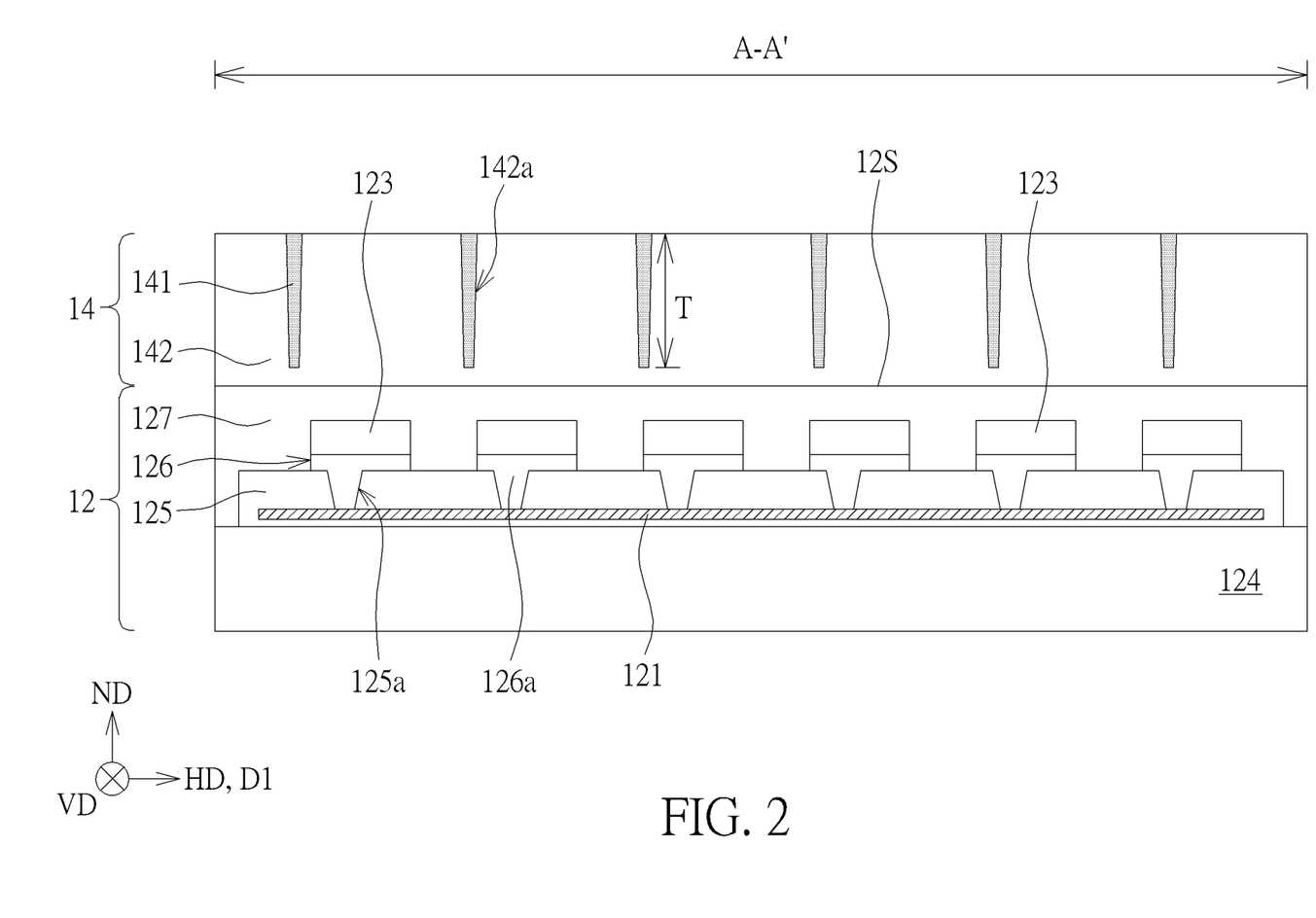
FIG. 2 is a schematic cross-sectional view of the display device taken along a line A-A' of FIG. 1 according to an embodiment of the present disclosure.

Refer to FIG. 1 and FIG. 2. FIG. 1 is a schematic top view of a display device according to an embodiment of the present disclosure, and FIG. 2 is a schematic cross-sectional view of the display device taken along a line A-A' of FIG. 1 according to an embodiment of the present disclosure. As shown in FIG. 1 and FIG. 2, the display device 1 may include a display panel 12 and a light controller 14. The display panel 12 may be used to display static or dynamic images that are displayed from a display surface 12S thereof. When the display device 1 is placed below a windshield of a vehicle, such as applied to a dashboard or a central control panel of the vehicle, the display panel 12 may display required meter data or other suitable information or patterns, but applications of the display device 1 are not limited to vehicles. The display device 1 may have a horizontal viewing direction HD. In the present disclosure, the horizontal viewing direction HD may substantially be a horizontal direction of an image that a user normally views when the display device 1 displays the image. In some embodiments, the vehicle may be, for example, a car, a plane, a train, or other suitable vehicles. A car is taken as an example in the followings, but not limited thereto.

In the embodiment of FIG. 1, the display panel 12 may include a plurality of first signal lines 121, respectively extending along a first direction D1 parallel to the horizontal viewing direction HD, and used to transmit signals. The first signal line 121 may be any signal line extending along the first direction D1; for example, the first signal line 121 may be a scan line, a data line, an emission control line, a power line, or other suitable signal lines in the display panel 12. The first signal line 121 may be, for example, a straight line or a non-straight line. When the first signal line 121 is the straight line, the straight line may be parallel to the first direction D1. When the first signal line 121 is the non-straight line, the extension of the first signal line 121 along the first direction D1 may indicate that the first signal line 121 may extend in the first direction D1 as a whole.

As shown in FIG. 1, the display panel 12 may further include a plurality of second signal lines 122 extending along a third direction D3 different from the first direction D1. The third direction D3 may be, for example, parallel to a vertical direction VD perpendicular to the horizontal viewing direction HD, but not limited thereto. In the present disclosure, the vertical direction VD may be, for example, a vertical direction of the image that the user normally views when the display device 1 displays the image. The second signal line 122 may be, for example, a straight line or a non-straight line. The extension of the second signal line 122 along the third direction D3 may indicate that the second signal line 122 is parallel to the third direction D3 or that the second signal line 122 may extend in the third direction D3 as a whole, but not limited thereto. In the embodiment of FIG. 1, the second signal lines 122 may cross the first signal lines 121, and an insulating layer is disposed between each of the second signal lines 122 and each of the first signal lines 121 and electrically insulates the second signal lines 122 from the first signal lines 121, but not limited thereto. In some embodiments, the third direction D3 may be, for example, neither vertical nor parallel to the horizontal viewing direction HD. Signals transmitted by the second signal lines 122 may be, for example, different from the signals transmitted by the first signal lines 121. For example, the second signal line 122 may include a scan line, a data line, an emission control lines, a power line, or other signal lines in the display panel 12 that are different from the first signal lines 121. The first signal lines 121 and the second signal lines 122 may, for example, respectively include opaque conductive material, wherein the opaque conductive material may, for example, include metal or other suitable materials. For example, the first signal lines 121 and the second signal lines 122 may be formed of different metal layers, but not limited thereto.

Figure 8:
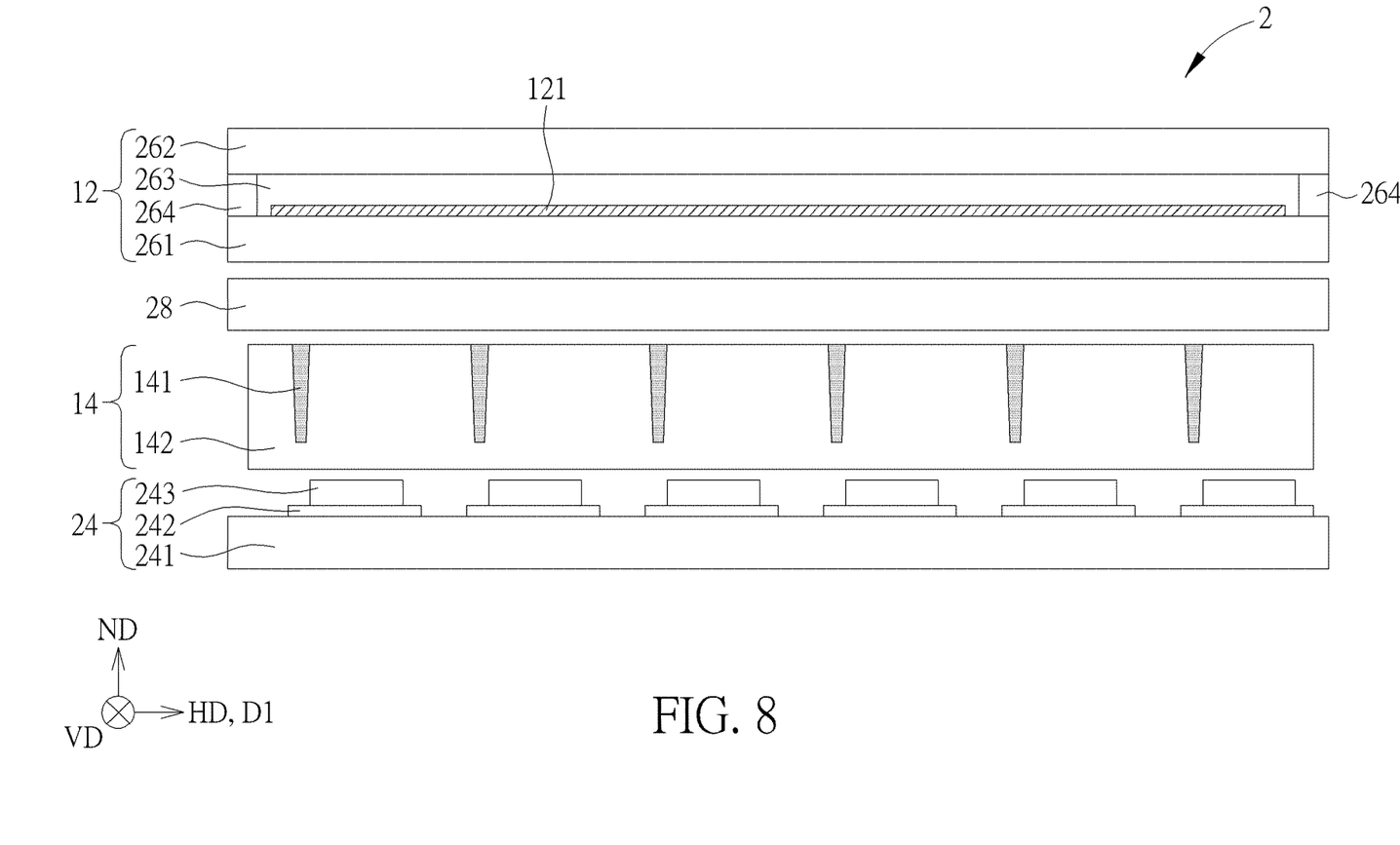
FIG. 8 is a schematic cross-sectional view of a display device according to another embodiment of the present disclosure.

In the embodiments as shown in FIG. 1 and FIG. 2, the display panel 12 may be, for example, a self-luminous display panel. Specifically, the display panel 12 may include a plurality of light-emitting elements 123. The light-emitting elements 123 are electrically connected to the first signal lines 121 and may generate light through the signals from the first signal lines 121, such that the display panel 12 may display an image. For example, the light-emitting elements 123 may serve as pixels or sub-pixels of the display panel 12, but not limited thereto. The light-emitting elements 123 may, for example, include the aforementioned light-emitting diodes or other suitable light-emitting elements. In some embodiments, the display panel 12 may be, for example, a monochrome or color display panel. When the display panel 12 is the monochrome display panel, the light-emitting elements 123 may generate light of the same color. Alternatively, when the display panel 12 is the color display panel, different ones of the light-emitting elements 123 may generate light of different colors. In some embodiments, the display panel 12 may also be replaced with a non-self-luminous display panel. For example, the display panel 12 may be a liquid crystal display panel including an upper polarizer and a lower polarizer. In this case, the display device may further include a backlight module, disposed on a back surface of the display panel 12 opposite to the display surface 12S, for example, as shown in FIG. 8.

As shown in FIG. 2, the display panel 12 may be, for example, an active matrix display panel. Specifically, the display panel 12 may further include a substrate 124, an insulating layer 125, an electrode layer 126, and a protective layer 127, but not limited thereto. The substrate 124 may include a transparent or an opaque substrate, or may include a flexible or a rigid substrate. For example, the substrate 124 may include, but not limited to, glass, quartz, plastic, or other substrates. The insulating layer 125 may be disposed on the substrate 124, and the display panel 12 may include thin-film transistors (not shown), the first signal lines 121, the second signal lines (not shown), and/or other elements for controlling the light-emitting elements 123 that are disposed in the insulating layer 125. For example, the display panel 12 may include one or more thin-film transistors for controlling the on/off of the light-emitting elements 123 and/or the brightness of light generated from the light-emitting elements 123. The electrode layer 126 may be disposed on the insulating layer 125 to electrically connect the light-emitting elements 123 and the first signal lines 121. For example, the electrode layer 126 may include a plurality of electrodes 126a. In the embodiment of FIG. 2, the insulating layer 125 may include a plurality of openings 125a, and the electrodes 126a may respectively extend into the corresponding openings 125a to be electrically connected to the corresponding first signal lines 121, but not limited thereto. It should be noted that, although FIG. 2 shows that one of the electrodes 126a may be in direct contact with the corresponding first signal line 121, other elements may be electrically connected between the electrode 126a and the corresponding first signal line 121. For example, one of the electrodes 126a may be electrically connected to a corresponding one of the corresponding first signal line 121 through one or more thin-film transistors. Viewed from a normal direction ND perpendicular to the display surface 12S, the size of one of the electrodes 126a shown in FIG. 2 may be less than or equal to the size of the corresponding light-emitting element 123, but not limited thereto. In some embodiments, the size of one of the electrodes 126a may be greater than the size of the corresponding light-emitting elements 123.

In the embodiment of FIG. 2, the light-emitting elements 123 are disposed on the corresponding electrodes 126a. For example, one of the light-emitting elements 123 may be disposed corresponding to one or more of the electrodes 126a, but not limited thereto. The protective layer 127 is disposed on the light-emitting elements 123 and the insulating layer 125 for protecting the light-emitting elements 123 and the insulating layer 125. For example, the protective layer 127 may reduce an invasion of moisture and oxygen into the light-emitting elements 123 and the insulating layer 125. The protective layer 127 may include, for example, a stack structure of an inorganic layer, an organic layer and an inorganic layer sequentially stacked, a stack structure of multiple inorganic layers, or other suitable structures.

In some embodiments, the display panel 12 may be a passive matrix display panel. In this case, one of the electrodes 126a may be in direct contact with the corresponding first signal line 121, and the display panel 12 may not include the thin-film transistors, but not limited thereto. In some embodiments, the structure of the display panel 12 is not limited to the mentioned above, and may be adjusted according to the requirements.

As shown in FIG. 1 and FIG. 2, the light controller 14 may be disposed adjacent to the display panel 12. In the embodiment of FIG. 2, the light controller 14 may be, for example, disposed on the display surface 12S of the display panel 12 for displaying images, but not limited thereto. The light controller 14 may be, for example, an element for limiting the traveling direction of light. In the embodiment of FIG. 1 and FIG. 2, the light controller 14 may include a plurality of light blocking patterns 141 and a transparent insulating layer 142. The transparent insulating layer 142 may include a plurality of grooves 142a, and the light blocking patterns 141 are respectively disposed in the grooves 142a. The light blocking patterns 141 and the grooves 142a may extend along the second direction D2, respectively. In the embodiment of FIG. 2, the groove 142a may not penetrate through the transparent insulating layer 142, but not limited thereto. In some embodiments, the groove 142a may penetrate through the transparent insulating layer 142.

As shown in FIG. 2, the transparent insulating layer 142 may include, for example, acrylate resin, epoxy resin, silicon resin, or other suitable materials. The material of the light blocking patterns 141 may include, for example, light blocking material, and the light blocking material may include, for example, a light absorbing material or a reflective material. For example, the light blocking material may include metal or an opaque insulating material, wherein the opaque insulating material may include black, gray, or white resin. In some embodiments, the opaque insulating material may include a photoresist material, an ink material, or other suitable materials. In some embodiments, a method for forming the light controller 14 may include, for example, coating transparent insulating material on a carrier or directly on the display panel 12, forming the grooves 142a in the transparent insulating material through an imprinting process or a nano-imprinting process, curing the transparent insulating material to form the transparent insulating layer 142, and then filling the grooves 142a with the light blocking material to form the light blocking patterns 141. After the light blocking patterns 141 are formed, a surface of the transparent insulating layer 142 may optionally further be cleaned. However, the method for forming the light controller 14 of the present disclosure is not limited thereto. In some embodiments, the light blocking patterns 141 and the transparent insulating layer 142 may be formed, for example, by an exposure and development process, a screen printing process, or an inkjet process, but not limited thereto. In some embodiments, curing the transparent insulating material may include a UV curing process, a thermal curing process, or other suitable curing processes. In some embodiments, when the light controller 14 is formed on the carrier, the carrier with the light controller 14 may be attached to the display surface 12S of the display panel 12 through pasting or sticking, but not limited thereto.

Figure 3:
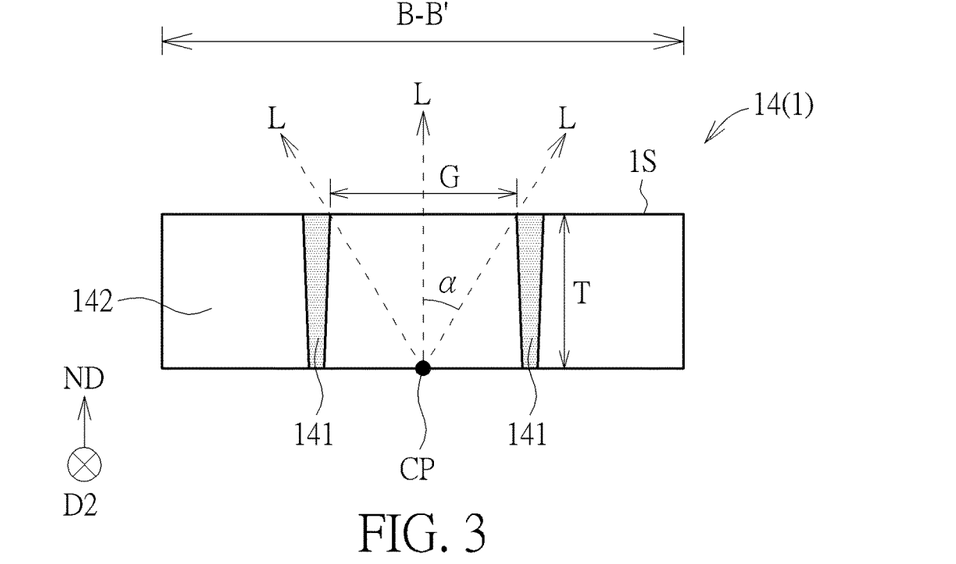
FIG. 3 is a schematic cross-sectional view of the display device taken along a line B-B' of FIG. 1 according to an embodiment of the present disclosure.

FIG. 3 is a schematic cross-sectional view of the display device taken along a line B-B' in FIG. 1 according to an embodiment of the present disclosure. In order to clearly show relations between the light blocking patterns 141, FIG. 3 shows a portion of the light blocking patterns 141 and the transparent insulating layer 142, but not limited thereto. As shown in FIG. 1 and FIG. 3, each of the light blocking patterns 141 may have a thickness T in the normal direction ND perpendicular to the display surface 12S, and a distance G may be between adjacent two of the light blocking patterns 141, as shown in FIG. 3. The distance G may be a minimum distance between the adjacent two of the light blocking patterns 141 in a direction perpendicular to the extending direction of the light blocking patterns 141 (i.e., the second direction D2). A viewing angle at which the user is able to see the images of the display device 1 may be controlled by adjusting a ratio (G/T) of the distance G to the thickness T. Specifically, as shown in FIG. 3, the ratio of the distance G to the thickness T may be 2×tan(α), wherein a center point CP is between bottoms of adjacent two of the light blocking patterns 141 and is substantially located on a same plane where the bottoms of the light blocking patterns 141 are located. An angle α may be defined as a maximum exit angle of a light L from the center point CP toward a display surface 1S of the display device 1. In other words, a size of the angle α may be approximately equal to a maximum viewing angle at which the user is able to see the images of the display device 1, but the viewing angle is not limited to the angle α. In some embodiments, the ratio of the distance G to the thickness T may be ranged from 0.5 to 3.5 (0.5≤G/T≤3.5), or the angle α may be ranged from about 15 degrees to about 60 degrees (15°≤α≤60°). The thickness T may, for example, be ranged from 50 micrometers to 200 micrometers (50 mm≤T≤200 mm). In some embodiments, the width of one of the light blocking patterns 141 in a direction perpendicular to the extending direction thereof (i.e., the second direction D2) may be, for example, about several micrometers, but not limited thereto. The widths of the light blocking patterns 141 may be reduced as thin as possible under a condition that light is able to be blocked by the light blocking patterns 141, so as to reduce an influence on the light output of the display device 1. In some embodiments, the distance G of the light blocking patterns 141 may be, for example, less than the width of one of the light-emitting elements 123 in the first direction D1 or the vertical direction VD.

Figure 4:
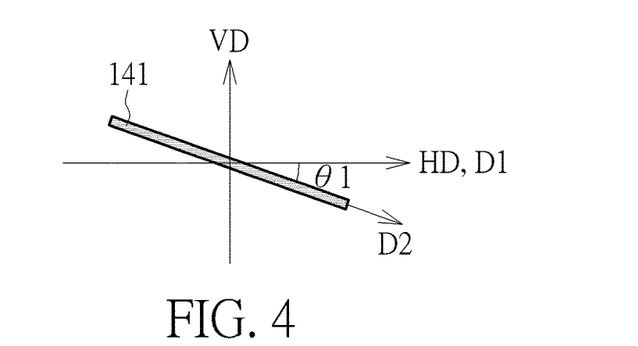
FIG. 4 is a schematic view showing a relative relation of the light blocking pattern to a first direction and a horizontal direction according to an embodiment of the present disclosure.

Refer to FIG. 4 in conjunction with FIG. 1. FIG. 4 is a schematic view of a relative relation of the light blocking pattern to the horizontal viewing direction HD and the vertical direction VD according to an embodiment of the present disclosure. As shown in FIG. 1 and FIG. 4, an angle θ1 may be between the first direction D1 parallel to the horizontal viewing direction HD and the second direction D2 in which the light blocking patterns 141 extend. In the present disclosure, the angle θ1 between two directions refers to an acute angle less than 90 degrees. In some embodiments, an absolute value of the angle θ1 may be greater than 0 degree and less than or equal to 45 degrees (0°<|θ1|≤45°). For example, the absolute value of the angle θ1 may be ranged from 3 degrees to 30 degrees (3°≤|θ1|≤30°), from 8 degrees to 26 degrees (8°≤|θ1|≤26°), or from 11 degrees to 24 degrees (11°≤|θ1|≤24°). It is worth mentioning that setting the extending direction of the light blocking patterns 141 (i.e., the second direction D2) to have the angle θ1 with respect to the extending direction of the first signal lines 121 (i.e., the first direction D1) and setting the absolute value of the angle θ1 to be greater than 0 degree and less than or equal to 45 degrees may reduce a brightness of the image emitted by the display panel 12 along the direction perpendicular to the second direction D2 or along the vertical direction VD. Therefore, when the display device 1 is configured to be placed below (or under) the windshield of the vehicle, the light controller 14 may be used to reduce the brightness of the light emitted by the display device 12 toward the windshield. In addition, when the extending direction of the light blocking patterns 141 is set to be substantially parallel to the extending direction of the first signal lines 121 (that is, the angle θ1=0°), although the brightness of the light emitted by the display device 12 toward the windshield may also be reduced, the light blocking patterns 141 and the first signal lines 121 generate Moiré pattern (Moiré interference fringes), which causes the user to feel uncomfortable when viewing the images. Therefore, in this embodiment, since the extending direction of the light blocking patterns 141 is different from or not parallel to the extending direction of the first signal lines 121, the Moiré pattern generated by the first signal lines 121 and the light blocking patterns 141 may be reduced or the user discomfort may be reduced. Accordingly, in applications of vehicles, the discomfort of a driver may be reduced to improve driving safety.

Figure 6:
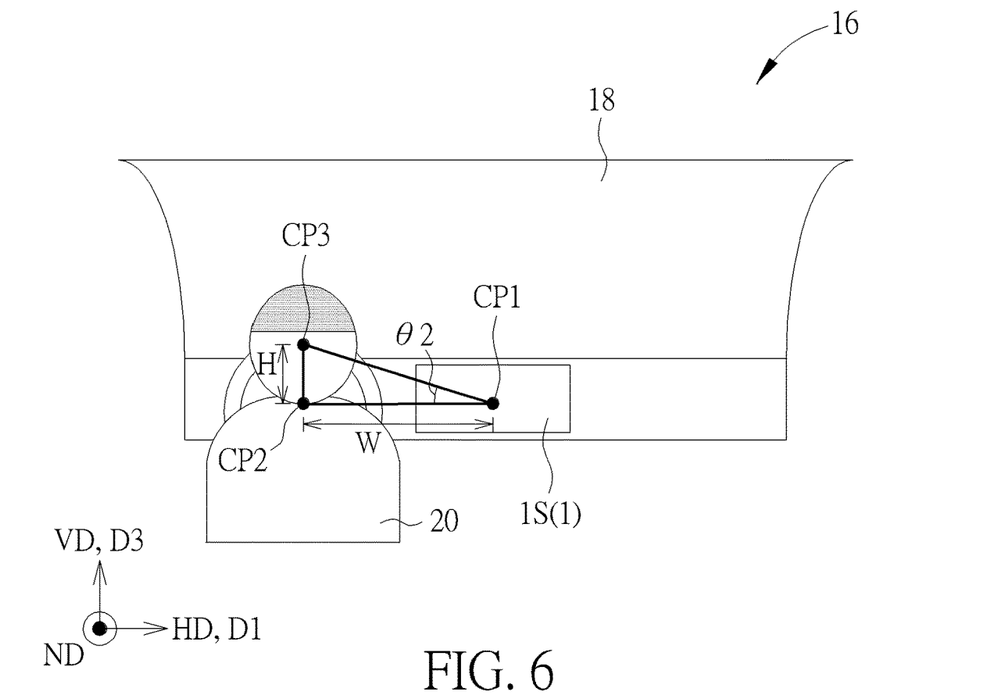
FIG. 6 is a schematic view of the display device configured below a windshield of a left-hand drive vehicle of the present disclosure.

As shown in FIG. 4, when the display device 1 is configured to be placed below (or under) the windshield of a left-hand drive vehicle (e.g., as shown in FIG. 6), the angle θ1 may be greater than or equal to −45 degrees and less than 0 degree (−45°≤θ1<0°). In some embodiments, the angle θ1 may, for example, be ranged from −3 degrees to −30 degrees (−30°≤θ1≤−3°), from −8 degrees to −26 degrees (−26°≤θ1≤−8°), or from −11 degrees to −24 degrees (−24°≤θ1≤−11°). It should be noted that the positive value and negative value of the angle θ1 are based on the first direction D1. When the first direction D1 rotates clockwise by the same angle as the angle θ1 to be parallel to the second direction D2, the angle θ1 is the negative value. On the contrary, when the first direction D1 rotates counterclockwise by the same angle as the angle θ1 to be parallel to the second direction D2, the angle θ1 is the positive value.

Figure 5:
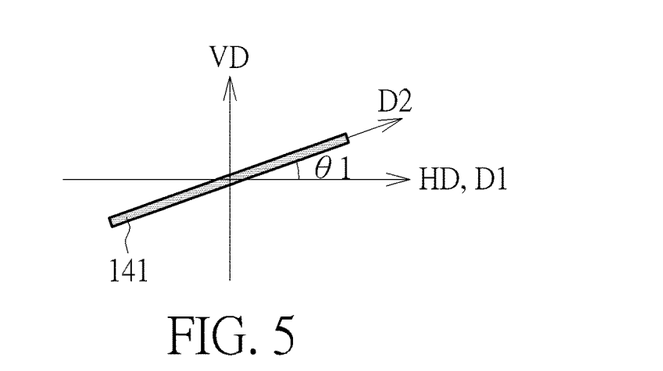
FIG. 5 is a schematic view of relative relations of the light blocking patterns to the first direction and the vertical direction, respectively, according to some embodiments of the present disclosure.
Figure 7:
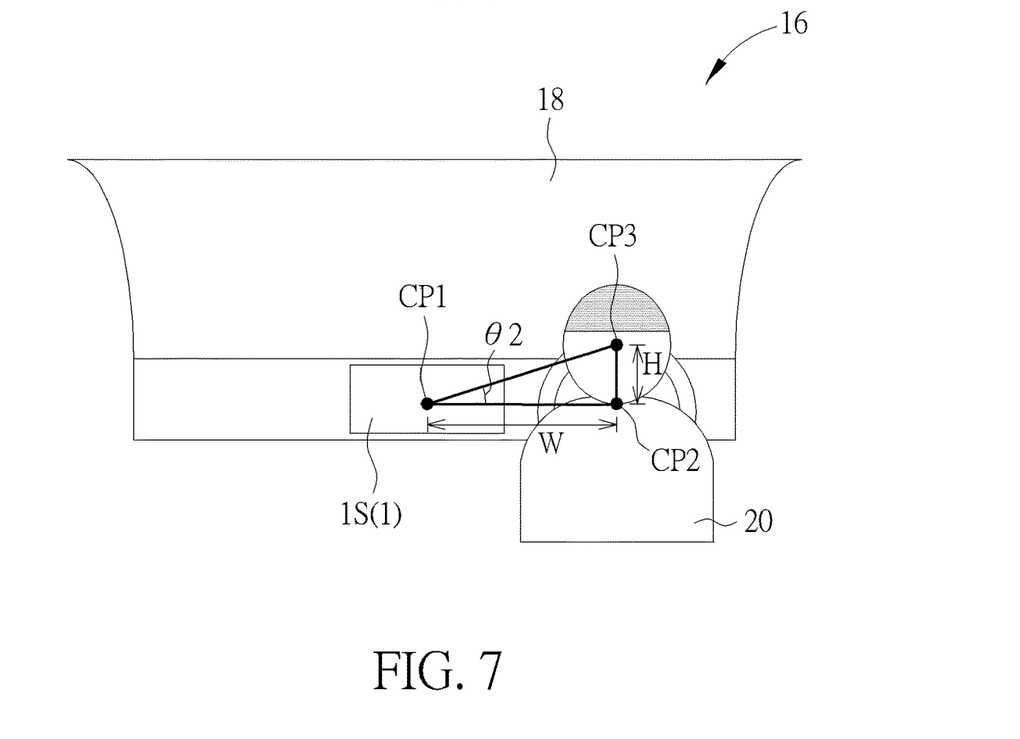
FIG. 7 is a schematic view of the display device configured below a windshield of a right-hand drive vehicle of the present disclosure.

FIG. 5 is a schematic view of a relative relation of the light blocking pattern to the first direction D1 and the horizontal direction VD according to some embodiments of the present disclosure. As shown in FIG. 5, when the display device 1 is configured to be placed below (or under) the windshield of a right-hand drive vehicle (e.g., as shown in FIG. 7), the angle θ1 may be greater than 0 degree and less than or equal to 45 degrees (0°<θ1≤45°). In some embodiments, the angle θ1 may, for example, be ranged from 3 degrees to 30 degrees (3°≤θ1≤30°), from 8 degrees to 26 degrees (8°θ1≤26°), or from 11 degrees to 24 degrees (11°≤θ1≤24°).

Refer to Table 1 together with FIG. 4. Table 1 lists the brightness of the light emitted by the display device 1 toward the driver along the first direction D1 and the brightness of the light emitted by the display device 1 toward the windshield along the vertical direction VD by the display device 1 in the cases of different angles θ1 when the display device is configured to be placed below the windshield of the left-hand drive vehicle. In Table 1, the brightness refers to a relative brightness of light emitted along different directions in the cases of different angles θ1, and a value of the maximum measured brightness is 100. It can be seen from Table 1 that when the angle θ1 is 0 degree, the brightness of the light emitted by the display device 1 toward the driver along the first direction D1 may be 100, and the brightness of light emitted by the display device 1 toward the windshield along the vertical direction VD may be 0. However, in this case, the light blocking patterns 141 and the first signal lines 121 may generate the Moiré pattern. When the angle θ1 is ranged from −3 degrees to −30 degrees, the brightness of the light emitted by the display device 1 toward the driver along the first direction D1 may be greater than 50, so that the driver may view the image of the display device 1 more clearly. In some embodiments, since there may be errors in the process for manufacturing the light controller 14, in order to reduce the Moiré pattern generated by the light blocking patterns 141 and the first signal lines 121, the angle θ1 may be less than or equal to −8 degrees. In addition, when the brightness of the light emitted by the display device 1 toward the windshield along the vertical direction VD is higher, the user is more likely to be disturbed by the light reflected from the windshield. Therefore, the light output towards the windshield may be reduced to be less than about 10, by designing the angle θ1 to be greater than or equal to −26 degrees. Similarly, in some embodiments, as shown in FIG. 5, when the display device 1 is configured to be placed below the windshield of a right-hand drive vehicle, the angle θ1 is designed to be ranged from 3 degrees to 30 degrees, which may make the driver be able to clearly view the image of the display device 1. In this case, when the angle θ1 is ranged from 8 degrees to 26 degrees, the Moiré pattern generated by the light blocking patterns 141 and the first signal lines 121 may be reduced, and the interference of light reflected from the windshield to the driver may be reduced.

TABLE 1

| angle θ1 (°) | brightness of light emitted toward driver along first direction D1 by display device 1 | brightness of light emitted toward windshield along vertical direction VD by display device 1 |
|---|---|---|
| 0 | 100.00 | 0.0 |
| −3 | 94.77 | 0.1 |
| −5 | 91.28 | 0.4 |
| −8 | 86.08 | 1.0 |
| −10 | 82.64 | 1.5 |
| −12 | 79.21 | 2.2 |
| −15 | 74.12 | 3.4 |
| −17 | 70.76 | 4.4 |
| −19 | 67.44 | 5.4 |
| −21 | 64.16 | 6.6 |
| −23 | 60.93 | 7.9 |
| −25 | 57.74 | 9.4 |
| −26 | 56.16 | 10.1 |
| −28 | 53.05 | 11.7 |
| −30 | 50.00 | 13.4 |
| −32 | 47.01 | 15.2 |

Refer to FIG. 6 and Table 2. FIG. 6 is a schematic view of the display device configured to be placed below the windshield of the left-hand drive vehicle of the present disclosure. As shown in FIG. 6, in the left-hand drive vehicle 16, a driver 20 is located on a left side of the vehicle 16. When the display device 1 is configured to be placed below (or under) the windshield 18 of the left-hand drive vehicle 16, for example, as a central control panel of the vehicle 16, designing the angle θ1 to be ranged from −11 degrees to −24 degrees facilitates meeting the design requirements of the vehicle 16, so that most drivers 20 with different sizes may view the image of the display device 1, and the brightness of light reflected by the windshield 18 may be reduced.

Specifically, as shown in FIG. 6, a projection of the driver 20 onto the same plane as the display surface 1S of the display device 1 may have a center point CP2 located on the same horizontal plane as the center point CP1 of the display device 1. That is, a connecting line of the center point CP2 and the center point CP1 is parallel to the horizontal viewing direction HD, and a distance W is between the center point CP1 and the center point CP2 in the horizontal viewing direction HD. When the driver 20 views the center point CP1 of the display device 1, a height H may be between a projection CP3 of a center point between eyes of the driver 20 onto the same plane as the display surface 1S of the display device 1 and the center point CP2. A viewing angle θ2 at which the driver 20 may approximately view the display device 1 may be obtained through the height H and the distance W. As can be seen from Table 2, in a design of a general left-hand drive vehicle 16, the viewing angle θ2 of the driver 20 viewing the display device 1 may approximately be ranged from 10.1 degrees to 27.2 degrees. By designing the angle θ1 between the extending direction of the light blocking patterns 141 (i.e., the second direction D2) and the extending direction of the first signal lines 121 (i.e., the first direction D1) to be ranged from −11 degrees to −24 degrees, the display device 1 may provide sufficient brightness of light for most drivers 20 to meet the design requirements of the vehicle 16.

TABLE 2

| viewing angle θ2 (°) | height H (millimeter) | width W (millimeter) |
|---|---|---|
| 10.1 | 80 | 450 |
| 11.3 | 80 | 400 |
| 12.9 | 80 | 350 |
| 16.1 | 130 | 450 |
| 18.0 | 130 | 400 |
| 20.4 | 130 | 350 |
| 21.8 | 180 | 450 |
| 24.2 | 180 | 400 |
| 27.2 | 180 | 350 |

Refer to FIG. 7, which is a schematic view of the display device configured to be placed below a windshield of a right-hand drive vehicle of the present disclosure. As shown in FIG. 7, in the right-hand vehicle 16, the driver 20 is located on a right side of the vehicle 16. As shown in Table 2, similar to the above-mentioned left-hand drive vehicle 16, when the display device 1 is configured to be placed below (or under) the windshield 18 of the right-hand drive vehicle 16, for example, as the central control panel of the vehicle 16, the angle θ1 is designed to be ranged from 11 degrees to 24 degrees, which may facilitate meeting the design requirements of the vehicle 16, so that most drivers 20 with different sizes may view the image of the display device 1, and the brightness of light reflected by the windshield 18 may be reduced.

Refer to FIG. 8, which is a schematic cross-sectional view of a display device according to another embodiment of the present disclosure. The difference between a display device 2 provided in this embodiment and the display device 1 shown in FIG. 2 is that the display device 2 in this embodiment may be a non-self-luminous display device. In the embodiment of FIG. 8, the display device 2 is exemplified as a liquid crystal display device, and the display panel 12 may be a liquid crystal display panel, but not limited thereto. Specifically, as shown in FIG. 8, in addition to the display panel 12 and the light controller 14, the display device 2 may further include a backlight module 24, and the light controller 14 is disposed between the backlight module 24 and the display panel 12, but not limited thereto. For example, in some embodiments, the light controller 14 may be located above the display panel 12. The backlight module 24 may include a circuit board 241, a plurality of electrodes 242 and a plurality of light-emitting elements 243. The light-emitting elements 243 may be disposed on the circuit board 241 and electrically connected to the circuit board 241 through the electrodes 242. In some embodiments, the backlight module 24 may not include the electrodes 242, such that the light-emitting elements 243 may be directly disposed on the circuit board 241, but not limited thereto. In the embodiment of FIG. 8, the backlight module 24 may be, for example, a direct-lit backlight module, and the light-emitting elements 243 are disposed under the display panel 12, but not limited thereto. In some embodiments, the backlight module 24 may be an edge-lit backlight module. In the edge-lit backlight module, the backlight module 24 may further include a light guide plate, and the light-emitting elements 243 and the circuit board 241 may be disposed on at least one side of the light guide plate, but not limited thereto.

As shown in FIG. 8, the display panel 12 may include a first substrate 261, a second substrate 262, a liquid crystal layer 263, and the first signal lines 121, wherein the liquid crystal layer 263 is disposed between the first substrate 261 and the second substrate 262. The first substrate 261 and the second substrate 262 may respectively include flexible or rigid transparent substrates. For example, the first substrate 261 and the second substrate 262 may include glass, quartz, plastic, or other substrates, but not limited thereto. The first substrate 261 and the second substrate 262 may be attached to each other and the liquid crystal layer 263 is sealed between the first substrate 261 and the second substrate 262 through a sealant 264. The liquid crystal layer 263 may include a plurality of liquid crystal molecules for controlling the brightness of light passing through the liquid crystal layer 263. In the embodiment of FIG. 8, the first signal lines 121 extending along the first direction D1 may be disposed between the first substrate 261 and the liquid crystal layer 263, wherein the first direction D1 is parallel to the horizontal viewing direction HD. In order to clearly show the first signal lines 121, FIG. 8 omits other elements in the display panel 12, such as thin-film transistors, other signal lines, color filters, black matrix, or other required elements, but the present disclosure is not limited thereto. Although FIG. 8 shows that the first signal lines 121 is in contact with the first substrate 261, other elements may optionally exist between the first signal lines 121 and the first substrate 261, such as other signal line, other insulating layer, or other suitable elements in the display panel 12. Since the first signal lines 121 and the horizontal viewing direction HD of this embodiment may be the same as those of the embodiments shown in FIG. 1 and FIG. 2, and details will not reiterated herein. In some embodiments, the first signal lines 121 may be disposed between the liquid crystal layer 263 and the second substrate 262, but not limited thereto. It should be noted that the light controller 14 of this embodiment may be the light controller 14 of any of the above embodiments, and a range of the angle between the extending direction of the light blocking patterns 141 of the light controller 14 and the extending direction of the first signal lines 121 may adopt the range of any of the above embodiments, and thus will not reiterated herein. In some embodiments, the display panel 12 may include two polarizers (not shown) respectively disposed on a lower side of the first substrate 261 and an upper side of the second substrate 262. In some embodiments, the display panel 12 shown in FIG. 8 may be any type of liquid crystal display panel.

In the embodiment of FIG. 8, the display device 2 may optionally include an optical film 28 disposed between the display panel 12 and the light controller 14 to enhance the optical effect of the display device 2. For example, the optical film 28 may include a diffuser film, a brightness enhancement film, and/or other suitable optical films.

Figure 9A:
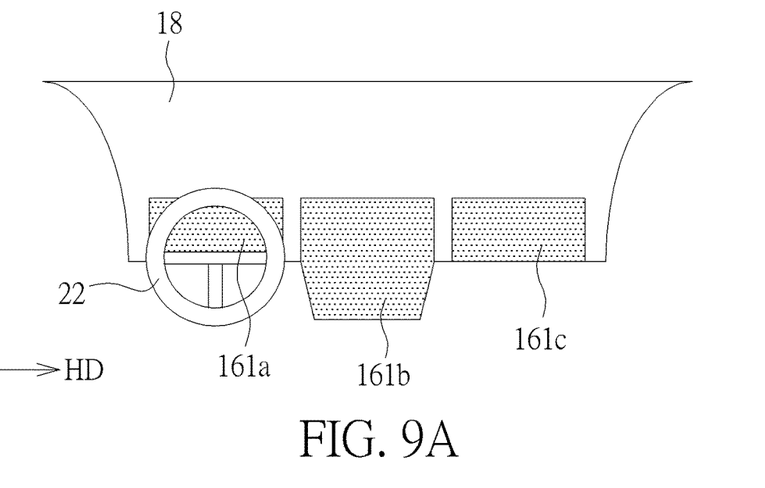
FIG. 9A to FIG. 9C are schematic views of windshields of vehicles and the devices configured thereunder according an embodiment of the present disclosure.
Figure 9B:
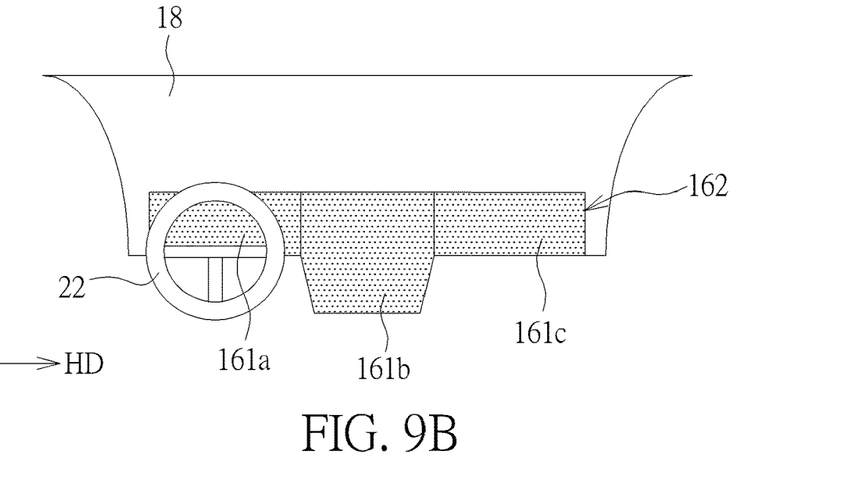
Figure 9C:
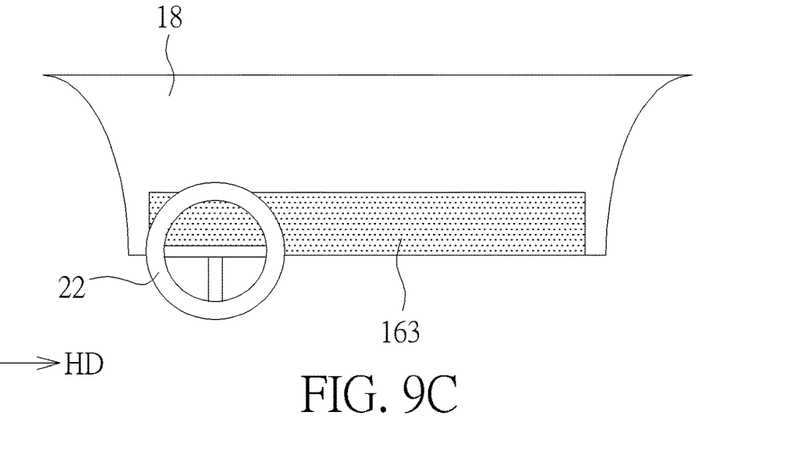

Refer to FIG. 9A to FIG. 9C, which are schematic views illustrating windshields of vehicles and the devices configured to be placed thereunder according an embodiment of the present disclosure. As shown in FIG. 9A, the vehicle may include a dashboard device 161a, a central control device 161b, and a passenger device 161c, which are disposed below or under the windshield 18. The dashboard device 161a is disposed between a steering wheel 22 and the windshield 18. The dashboard device 161a, the central control device 161b, and a passenger device 161c are substantially arranged in sequence along the horizontal viewing direction HD. In this case, at least one of the dashboard device 161a, the central control device 161b and the passenger device 161c may include the display device of any of the above-mentioned embodiments.

As shown in FIG. 9B, the vehicle may include a dashboard control panel 162 disposed below or under the windshield 18. The dashboard control panel 162 may include the dashboard device 161a, the central control device 161b, and the passenger device 161c. In other words, the dashboard device 161a, the central control device 161b, and the passenger device 161c may be assembled into a whole. In this case, at least one of the dashboard device 161a, the central control device 161b, and the passenger device 161c may include the display device of any of the above-mentioned embodiments.

As shown in FIG. 9C, the vehicle may include a single display device 163 disposed below or under the windshield 18 and between the windshield 18 and the steering wheel 22. The display device 163 may extends along the horizontal viewing direction HD from a position corresponding to the steering wheel 22 to a position corresponding a passenger's seat. In this case, the display device 163 may include the display device of any of the above-mentioned embodiments.

In summary, in the display device of the present disclosure, through the installation of the light controller, the brightness of the light emitted by the display device toward the windshield may be reduced in the application of vehicles, so as to reduce the light reflected from the windshield from interfering with the driver. Furthermore, through designing the absolute value range of the angle between the extending direction of the light blocking patterns of the light controller and the extending direction of the first signal lines to be greater than 0 degree and less than or equal to 45 degrees, the Moiré pattern generated by the light blocking patterns and the first signal lines may be reduced. In this way, the driving safety of the driver may be increased.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device in application of a vehicle, comprising:
  a self-luminous display device and a non-self-luminous display device;
  wherein at least one of the self-luminous display device or the non-self-luminous display device comprises:
    a display panel comprising a plurality of first signal lines respectively extending along a first direction; and
    a light controller disposed adjacent to the display panel, comprising a plurality of light blocking patterns respectively extending along a second direction;
    wherein the second direction has an angle with respect to the first direction, an absolute value of the angle is greater than 0 degree and less than or equal to 45 degrees, and the self-luminous display device and the non-self-luminous display device are arranged along the first direction.

2. The display device as claimed in claim 1, wherein the at least one of the self-luminous display device or the non-self-luminous display device is the non-self-luminous display device.

3. The display device as claimed in claim 2, wherein the non-self-luminous display device further comprises a backlight module, and the light controller is disposed between the backlight module and the display panel.

4. The display device as claimed in claim 1, wherein the light controller is for limiting a traveling direction of light.

5. The display device as claimed in claim 1, wherein a material of one of the plurality of light blocking patterns comprises a light absorbing material or a reflective material.

6. The display device as claimed in claim 1, wherein the self-luminous display device and the non-self-luminous display device are two of a dashboard device, a central control device and a passenger device.

7. The display device as claimed in claim 1, wherein the self-luminous display device and the non-self-luminous display device are assembled into a whole.

8. The display device as claimed in claim 1, wherein the self-luminous display device and the non-self-luminous display device are separated from each other.

9. The display device as claimed in claim 1, wherein the vehicle is a left-hand drive vehicle, the at least one of the self-luminous display device or the non-self-luminous display device is a central control device of the left-hand drive vehicle, and the angle is ranged from −3 degrees to −30 degrees.

10. The display device according to claim 1, wherein the vehicle is a right-hand drive vehicle, the at least one of the self-luminous display device or the non-self-luminous display device is a central control device of the right-hand drive vehicle, and the angle is ranged from 3 degrees to 30 degrees.

* * * * *